United States Patent
Zhang et al.

(10) Patent No.: US 7,009,433 B2
(45) Date of Patent: Mar. 7, 2006

(54) DIGITALLY CONTROLLED DELAY CELLS

(75) Inventors: Fulong Zhang, Willow Grove, PA (US); William B. Andrews, Allentown, PA (US); Phillip Johnson, Allentown, PA (US); Hal Scholz, Allentown, PA (US); Zheng (Jeff) Chen, Allentown, PA (US); John Schadt, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 26 days.

(21) Appl. No.: 10/447,451

(22) Filed: May 28, 2003

(65) Prior Publication Data

US 2004/0239387 A1   Dec. 2, 2004

(51) Int. Cl.
*H03L 7/06* (2006.01)

(52) U.S. Cl. ...................... 327/158; 327/161

(58) Field of Classification Search ............... 327/149, 327/158, 161
See application file for complete search history.

(56) References Cited

U.S. PATENT DOCUMENTS

| | | | |
|---|---|---|---|
| 5,883,534 A * | 3/1999 | Kondoh et al. | 327/156 |
| 6,043,677 A | 3/2000 | Albu et al. | 326/39 |
| 6,194,928 B1 * | 2/2001 | Heyne | 327/152 |
| 6,252,443 B1 * | 6/2001 | Dortu et al. | 327/156 |
| 6,414,521 B1 * | 7/2002 | Potter et al. | 327/67 |
| 6,657,467 B1 * | 12/2003 | Seki et al. | 327/158 |
| 6,741,107 B1 * | 5/2004 | Borkar et al. | 327/153 |
| 2003/0001650 A1 * | 1/2003 | Cao et al. | 327/277 |

* cited by examiner

*Primary Examiner*—Quan Tra
(74) *Attorney, Agent, or Firm*—MacPherson Kwok Chen & Heid LLP; Greg J. Michelson

(57) ABSTRACT

Systems and methods are disclosed herein to implement signal delay in integrated circuits. For example, in accordance with an embodiment of the present invention, a master delay circuit may digitally control one or more slave delay cells to support various applications of a programmable logic device.

18 Claims, 9 Drawing Sheets

DIGITALLY CONTROLLED DELAY CELLS

TECHNICAL FIELD

The present invention relates generally to electrical circuits and, more particularly, to the application of delays and control of delay cells in programmable logic devices.

BACKGROUND

Programmable logic devices, such as for example a field programmable gate array (FPGA) or a complex programmable logic device (CPLD), often include general purpose input/output circuits that are programmable to support numerous input/output interface standards. The input/output interface standards typically have a wide range of requirements that must be satisfied.

As an example, some types of input/output interface standards (e.g., double data rate (DDR) synchronized dynamic random access memory (SDRAM) interface standard) require a delay inserted in the data path or the clock path to reliably capture the data. A typical delay cell that is utilized to provide a signal delay may provide a delay that varies widely over process, voltage, and temperature. The delay range, for example, may be 2:1 to more than 3:1 for the maximum to minimum delay ratio. For a stringent input/output interface standard that requires a large delay on the data path or the clock path and also a narrow valid data window, the typical delay cell may fail to meet the requirement.

One type of delay cell, an analog delay cell, utilizes a feedback path to reduce the amount of variation due to process, voltage, or temperature fluctuations. Analog delay cells, however, often suffer from various limitations, such as noise susceptibility, delay precision limitations, or process refinement uncertainties.

Additionally, a path delay (e.g., clock injection delay) may be difficult to cancel or track with analog delay cells, because the path delay may vary greatly based on the size of a device (e.g., within a device family). Furthermore, the path delay may vary with process, voltage and temperature (e.g., due to transistor sizing, transistor type, type of delay such as resistor-capacitor vs. transistor delay ratio) in ways that make it difficult for analog delay cells to completely compensate. As a result, there is a need for improved techniques for implementing signal delays in programmable logic devices.

SUMMARY

Systems and methods are disclosed herein to implement signal delay in integrated circuits. For example, in accordance with an embodiment of the present invention, a digitally-controlled delay cell is implemented in a programmable logic device to delay a clock signal or a data signal. Furthermore, one or more master delay cells may control (e.g., digitally) one or more slave delay cells to support various functions of a programmable logic device. As an example, the master delay cell may control one or more slave delay cells to provide a fixed delay as a function of a reference clock cycle, cancel a path delay, or match a path delay.

More specifically, in accordance with one embodiment of the present invention, a programmable logic device includes a master delay-locked loop adapted to receive a reference clock signal and provide a digital control signal; a plurality of signal paths; and a plurality of slave delay cells disposed respectively within the plurality of signal paths and adapted to receive the digital control signal and provide a signal delay based on the digital control signal.

In accordance with another embodiment of the present invention, a delay cell architecture includes a master delay cell adapted to receive a reference clock signal and a feedback signal and provide a clock signal and digital control signals, wherein the master delay cell has means for generating a plurality of delayed versions of the reference clock signal and means for determining a phase between the reference clock signal or one of the plurality of delayed versions of the reference clock signal and the feedback signal or the reference clock signal to determine one or more values for the digital control signals; and a plurality of slave delay cells disposed on a plurality of corresponding signal paths and adapted to receive the digital control signals, wherein each of the slave delay cells has means for receiving an input signal and selectively applying a delayed output signal based on one of the digital control signals.

In accordance with another embodiment of the present invention, a method of inserting a delay into a plurality of signal paths of a programmable logic device includes receiving a reference clock signal; generating delayed versions of the reference clock signal; receiving a feedback clock signal; selecting between the reference clock signal and one of the delayed versions of the reference clock signal to provide a first signal; selecting between the reference clock signal and the feedback clock signal to provide a second signal; determining a phase difference between the first signal and the second signal; and providing one or more control signals based on the determined phase difference to delay cells within the plurality of signal paths.

In accordance with another embodiment of the present invention, a master delay-locked loop circuit, within a programmable logic device, includes a series of delay cells adapted to receive a reference clock signal and provide delayed versions of the reference clock signal; a first multiplexer adapted to select either the reference clock signal or one of the delayed versions of the reference clock signal and provide a first output signal; a second multiplexer adapted to select either the reference clock signal or the first output signal and provide a clock output signal from the master delay-locked loop circuit; a third multiplexer adapted to select either the reference clock signal or the first output signal and provide a second output signal; a fourth multiplexer adapted to select either the reference clock signal or a feedback signal received by the master delay-locked loop circuit and provide a third output signal; and a control logic circuit adapted to receive the second output signal and the third output signal and generate a digital control signal.

In accordance with another embodiment of the present invention, a slave delay cell, within a programmable logic device, includes a coarse stage adapted to receive an input signal and provide delayed versions of the input signal; a first multiplexer adapted to select either the input signal or one of the delayed versions of the input signal and provide a first output signal; a fine stage coupled to the first multiplexer and adapted to receive the first output signal and provide fine delayed versions of the first output signal, and a second multiplexer adapted to select either the first output signal or one of the fine delayed versions of the first output signal and provide a second output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
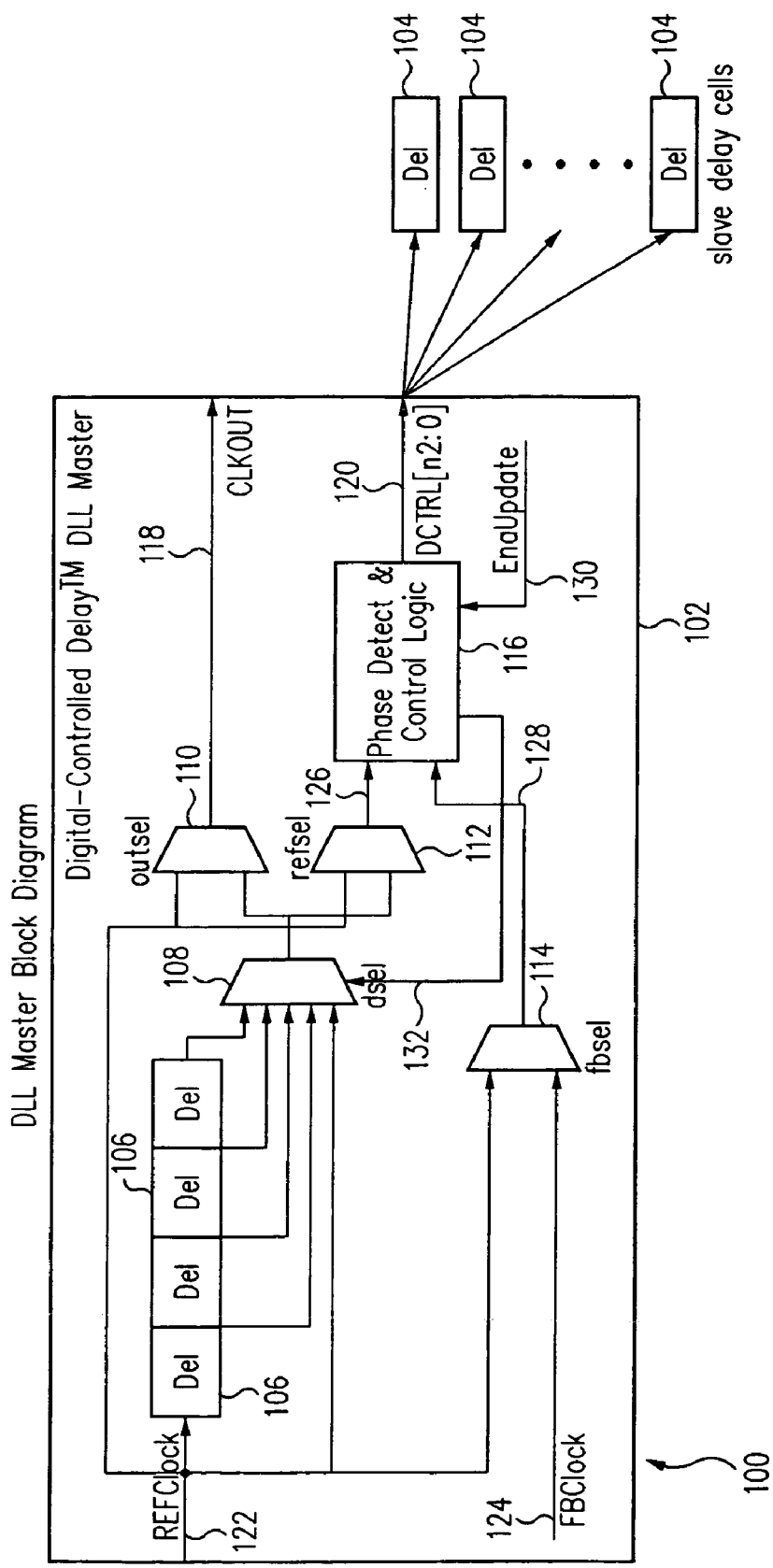
FIG. 1 shows a block diagram illustrating a master delay-locked loop and slave delay cells in accordance with an embodiment of the present invention.

FIG. 1 shows a block diagram of a delay cell architecture 100 illustrating a master delay-locked loop (DLL) 102 and slave delay cells 104 in accordance with an embodiment of the present invention. Delay cell architecture 100 may be incorporated into a programmable logic device to provide support for various functions, such as to determine and/or provide a delay for one or more input/output interface signals (e.g., data, clock, or control signals). Furthermore, as explained herein, more than one delay cell architecture 100 may be implemented in a programmable logic device.

Master DLL 102 receives a reference clock (REFClock) signal 122 and possibly a feedback clock (FBClock) signal 124 and provides a clock (CLKOUT) signal 118 and possibly one or more control (DCTRL[n2:0]) signals 120. Reference clock signal 122 is received by (or propagates through) a series of delay cells 106, with a multiplexer 108 selecting its output from reference clock signal 122 and delayed versions of reference clock signal 122 generated by delay cells 106.

Each one of delay cells 106 (each labeled Del) is substantially similar (if not identical to in most respects) to each one of slave delay cells 104 (each labeled Del). The number of delay cells 106 in series can be varied and will depend on the desired application. Generally, the number of delay cells 106 in series should be sufficient to at least provide a delay greater than an expected clock cycle of reference clock signal 122. Delay cells 106 and slave delay cells 104 are described in greater detail in reference to an exemplary circuit diagram shown in FIG. 2.

Multiplexers 110 and 112 (labeled outsel and refsel, respectively) select between reference clock signal 122 and an output signal from multiplexer 108 to provide clock signal 118 and an input signal 126 to a control logic circuit (phase detect and control logic) 116, respectively. A multiplexer 114 selects between reference clock signal 122 and feedback clock signal 124 to provide an input signal 128 to control logic circuit 116.

Control logic circuit 116 performs appropriate phase detection and control logic functions to control delay cells 106 and produce control signals 120, which are provided to slave delay cells 104. Control logic circuit 116 employs a feedback control signal (dsel) 132 to control multiplexer 108 and select reference clock signal 122 or delayed versions of reference clock signal 122 generated by delay cells 106. Control logic circuit 116 also receives an update signal (EnaUpdate) 130 that determines whether control logic circuit 116 can change the values of control signals 120.

As explained in further detail below, master DLL 102 may, for example, operate as a DLL to insert a delay or cancel or match clock injection delay on clock signal 118. Master DLL 102 may also produce control signals 120 (digital outputs), which for example results in slave delay cells 104 producing a delay equal to the clock injection delay or a delay equal to one clock cycle minus the clock injection delay. Master DLL 102 may also determine the number ("N") of delay cells 106 required for a whole clock cycle ("T") and then determine (e.g., using arithmetic operations) values required of control signals 120 which results in slave delay cells 104 matching a fixed delay (e.g., N/2 corresponding to T/2, N/4 corresponding to T/4, N/7 corresponding to T/7, or any fraction of a clock cycle) down to the precision of the minimum precision of slave delay cells 104.

Figure 2:
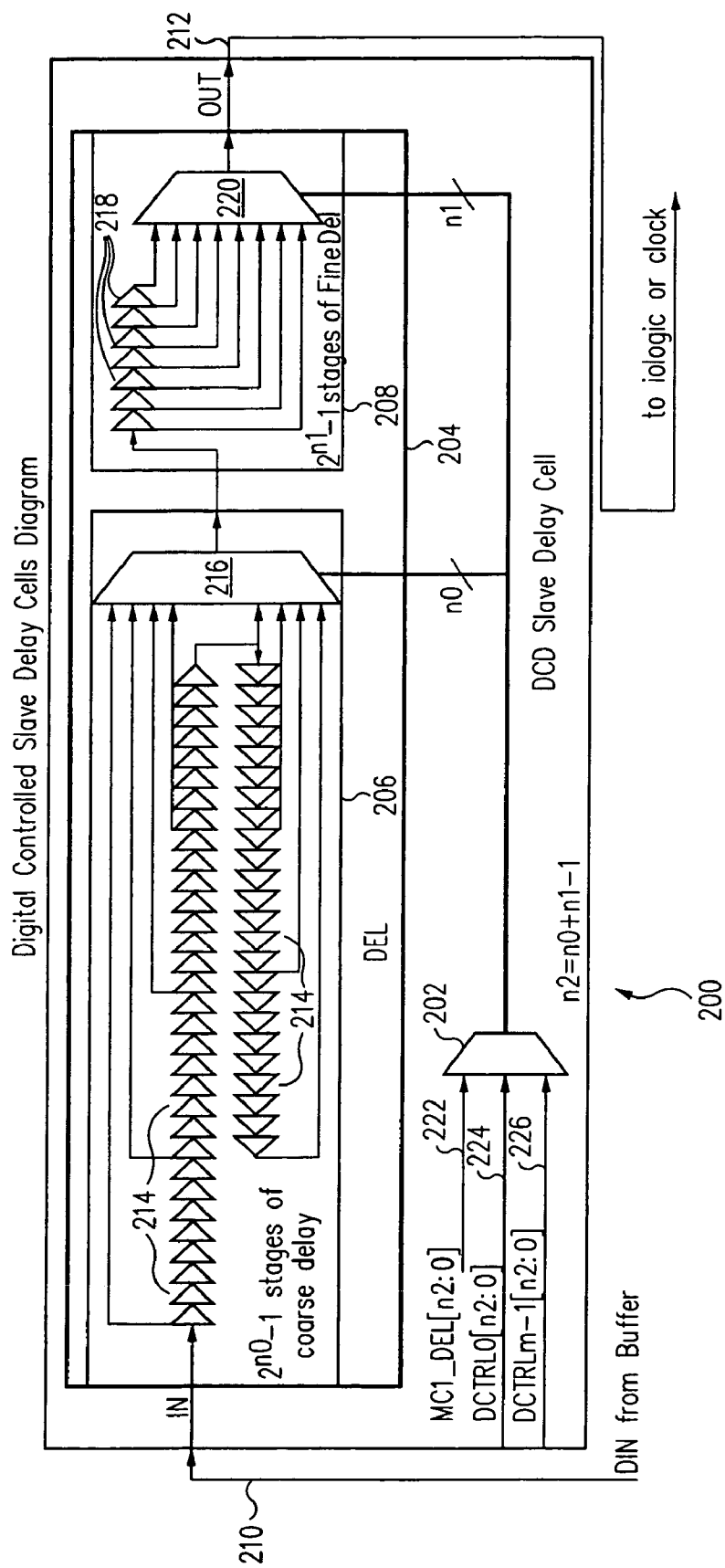
FIG. 2 shows a block diagram illustrating an exemplary circuit for one of the slave delay cells of FIG. 1.

FIG. 2 shows a block diagram illustrating an exemplary circuit 200 for one of slave delay cells 104 of FIG. 1. Circuit 200 receives an input signal 210 (e.g., a data signal such as input data (DIN) or a clock signal from input buffers) and provides an output signal 212 after having applied the desired amount of delay.

Circuit 200 includes delay circuits 204 (labeled Del) having a coarse delay 206 and a fine delay 208. Delay circuits 204 represent, for example, an exemplary two-stage delay that may be utilized by slave delay cells 104 and also delay cells 106 of FIG. 1. Coarse delay 206 includes a number of coarse delay stages 214, with each providing an output signal that may be selected by a multiplexer 216. For example, there may be $2^{n0}-1$ coarse delay stages 214. As shown in FIG. 2 as an example, there are seven of coarse delay stages 214 (i.e., $2^3-1$, where n0 equals 3). Each coarse delay stage 214 may comprise a number of delay elements, such as inverters or other known types of elements that provide a signal delay.

Fine delay 208 includes a number of fine delay stages 218, with each providing an output signal that may be selected by a multiplexer 220. For example, there may be $2^{n1}-1$ fine delay stages 218. As shown in FIG. 2 as an example, there are seven of fine delay stages 218 (i.e., $2^3-1$, where n1 equals 3). Multiplexer 220 selects the output signal from among fine delay stages 218 to provide as output signal 212 (e.g., a data signal or a clock signal).

Coarse delay 206 and fine delay 208, depending upon how combined and how the delay stages are arranged, can produce a selectable delay of approximately $2^{(n0+n1)}$. For example, as shown in FIG. 2, control signal 120 has 64 different delay options to choose from (i.e., $2^{(3+3)}$), which may range for example from approximately zero delay to maximum delay.

A multiplexer 202 selects a control signal that is used to control multiplexers 216 and 220. For example, multiplexer 202 may receive a control signal (MC1_DEL[n2:0]) 222, a control signal (DCTRL0[n2:0]) 224, and a control signal (DCTRL(m−1)[n2:0]) 226, which depending upon which control signal is selected by multiplexer 202, controls the amount of delay applied by coarse delay 206 and fine delay 208.

As an example, control signal 222 may be provided by memory cells of the programmable logic device, while control signals 224 and 226 may be provided by two corresponding master DLLs 102. Control signals 224 and 226 correspond to control signals 120 from the associated master DLLs 102. Thus, there may be one or more master DLLs 102 (e.g., "m" master DLLs 102) that provide a control signal (i.e., a corresponding control signal 120), depending upon the application, to each of circuits 200 (e.g., slave delay cells 104).

In general, when using memory cells to provide control signal 222 to one or more slave delay cells 104, slave delay cells 104 may behave as conventional delay cells that vary with process, voltage, and temperature. However, when using master DLL 102 to control one or more slave delay cells 104, slave delay cells 104 provide variable precision delays, such as for canceling or matching particular delay paths or matching some fraction of a clock cycle.

In accordance with an embodiment of the present invention, master DLL 102 digitally controls slave delay cells 104. For example, slave delay cells 104 may be in each programmable input/output clock and data path, such as between the input/output buffer and the input/output control logic of a programmable logic device. The amount of delay in the data path and the clock path may each be controlled separately to have a programmably different delay due to their separate locations and paths and under control of different master DLLs 102. As an example, the signal after slave delay cells 104 will be used as a clock signal, if the associated input/output pad is assigned as a clock pin or input, or as a data signal otherwise.

Master DLL 102 may include delay cells arranged serially, which may be substantially identical to slave delay cells 104. Depending upon the operational mode, master DLL 102 may receive a continuous clock signal (e.g., reference clock signal 122) to determine the number of delay cells needed to cancel or to match a particular path delay. For example, clock injection delay may be canceled by utilizing the same path distribution and a feedback signal (e.g., feedback clock signal 124).

Master DLL 102 may also determine the amount of delay needed to account for a whole clock cycle of the clock signal. Because master DLL 102 is utilizing identical delay cells as slave delay cells 104, master DLL 102 can generate digital control signals (e.g., control signals 120) for slave delay cells 104 to cancel the identical path delay or determine the number of delay cells needed per clock cycle which can be manipulated to produce any fraction of the clock cycle. Thus, master DLL 102 produces digital control signals that can be utilized by slave delay cells 104 to reproduce any fixed delay value, with precision down to the smallest fine unit cell delay (e.g., one of fine delay stages 218 of fine delay 208).

Delay cell architecture 100 may provide many benefits over that of conventional delay cells. For example, delay cell architecture 100 may provide high noise immunity because the control signal is digital, generate virtually any delay value down to the smallest fine delay unit value, independence from process, voltage, and temperature conditions, may be used to cancel or match any path delay, and master DLL 102 may control any number of slave delay cells 104. Furthermore, delay cell architecture 100 may be employed for applications having stoppable clocks (e.g., by using master DLL 102 to control slave delay cells 104 that delay a stoppable clock) and is flexible to support many different types of input/output interface standards.

It should be noted that circuit 200 (FIG. 2) illustrates an exemplary binary system. However, any number of coarse and fine delay cell combinations besides a power of two may be implemented, which would be determined by the intended application. Consequently, the control logic implemented would be modified to account for the intended coarse and fine delay combinations.

Figure 3:
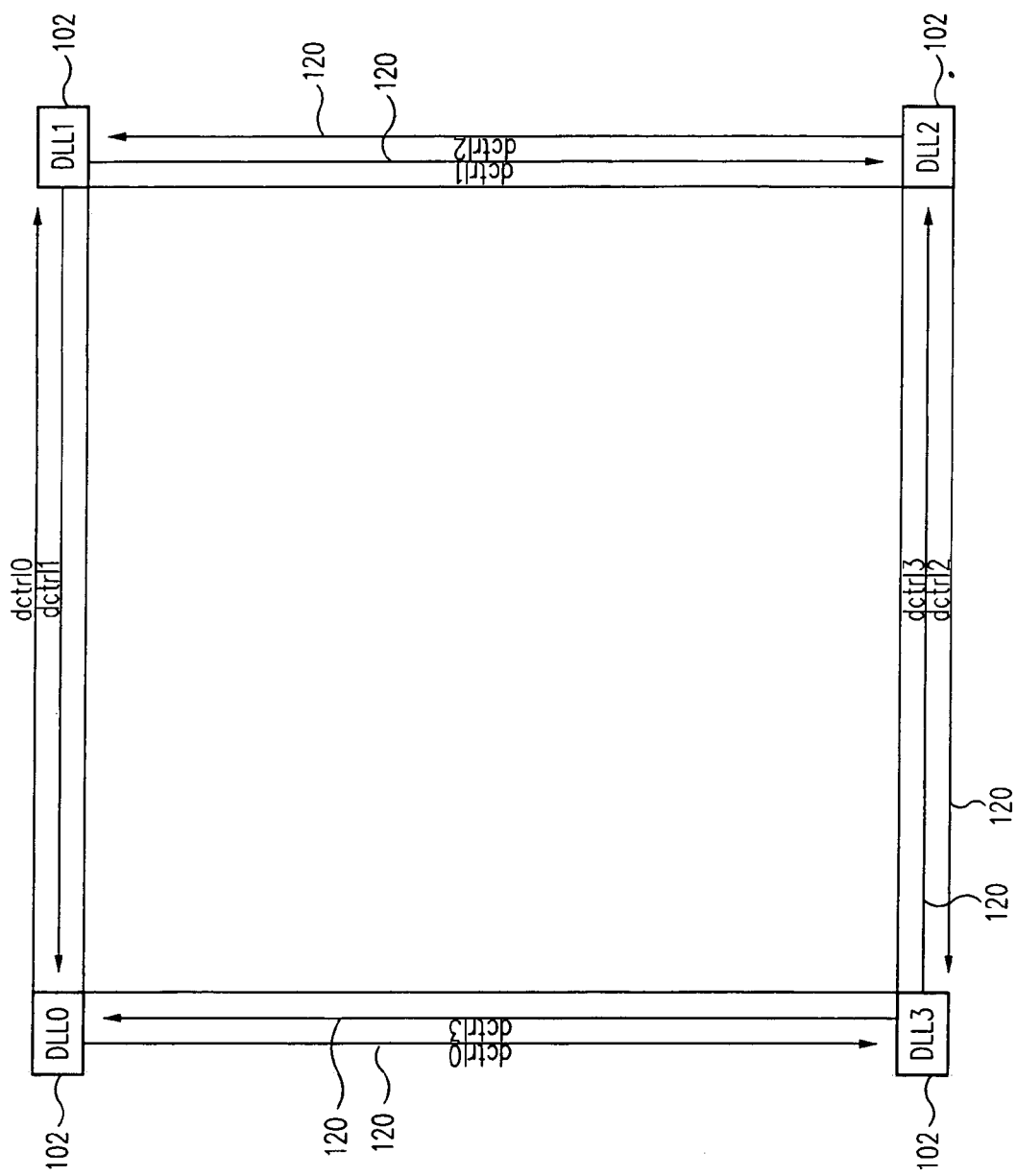
FIG. 3 shows a block diagram illustrating an exemplary integrated circuit layout for several of the master delay-locked loops of FIG. 1.

FIG. 3 shows a block diagram illustrating an exemplary integrated circuit layout having several of master DLLs 102 of FIG. 1. Master DLLs 102 may be positioned on corners of the integrated circuit, with corresponding control signals 120 routed along edges of the integrated circuit. Consequently, each edge of the integrated circuit has access to two different control signals 120 for slave delay cells 104 (not shown) positioned along the edge. For example, master DLL 102 (labeled DLL3) may be utilized to control delays for clock signals along the left edge of the integrated circuit, while master DLL 102 (labeled DLL0) may be utilized to control delays for data signals along the same left edge.

Figure 4:
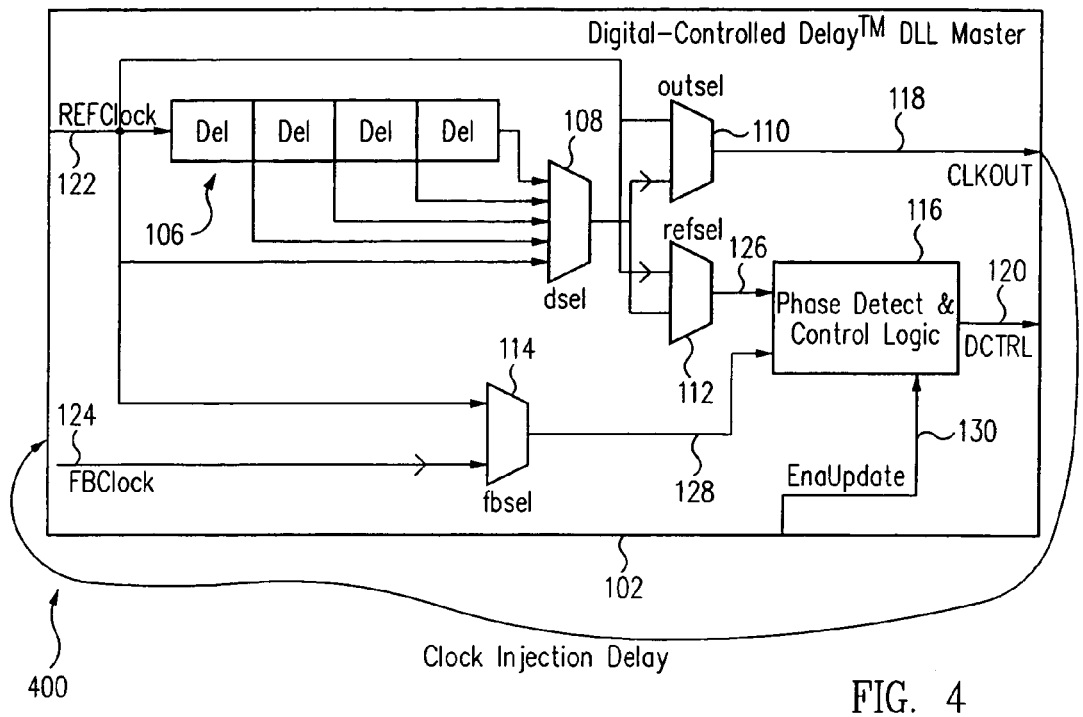
FIG. 4 shows a block diagram illustrating an exemplary application for the master delay-locked loop of FIG. 1.

FIG. 4 shows a block diagram illustrating an exemplary application 400 for master DLL 102 of FIG. 1. In this example, master DLL 102 is employed to cancel clock injection delay, where in this example the delay of delay cells 106 and the clock injection delay may be summed to equal one clock cycle of reference clock signal 122. Consequently, as indicated by arrows on their input terminals, multiplexer 110 selects an output signal from multiplexer 108, multiplexer 112 selects reference clock signal 122, and multiplexer 114 selects feedback clock signal 124. Feedback clock signal 124 results from clock signal 118 being fed back, via a path that experiences delay cells 106 in DLL 102 and clock injection delay, to allow master DLL 102 to measure and determine the required delay to apply.

Control signal 120 may also be generated and provided to slave delay cells 104 so that they can match the delay of master DLL 102 and cancel the clock injection delay on their corresponding signal paths also. This technique reduces the number of conventional phase-locked loop (PLL)/DLL requirements for multiple lane buses. For example, a 32-bit HyperTransport input/output interface requires four clocks, eight bits of data per clock, but only one clock needs to employ master DLL 102 while the remaining clocks operate through corresponding slave delay cells 104 that are controlled by master DLL 102.

Figure 5:
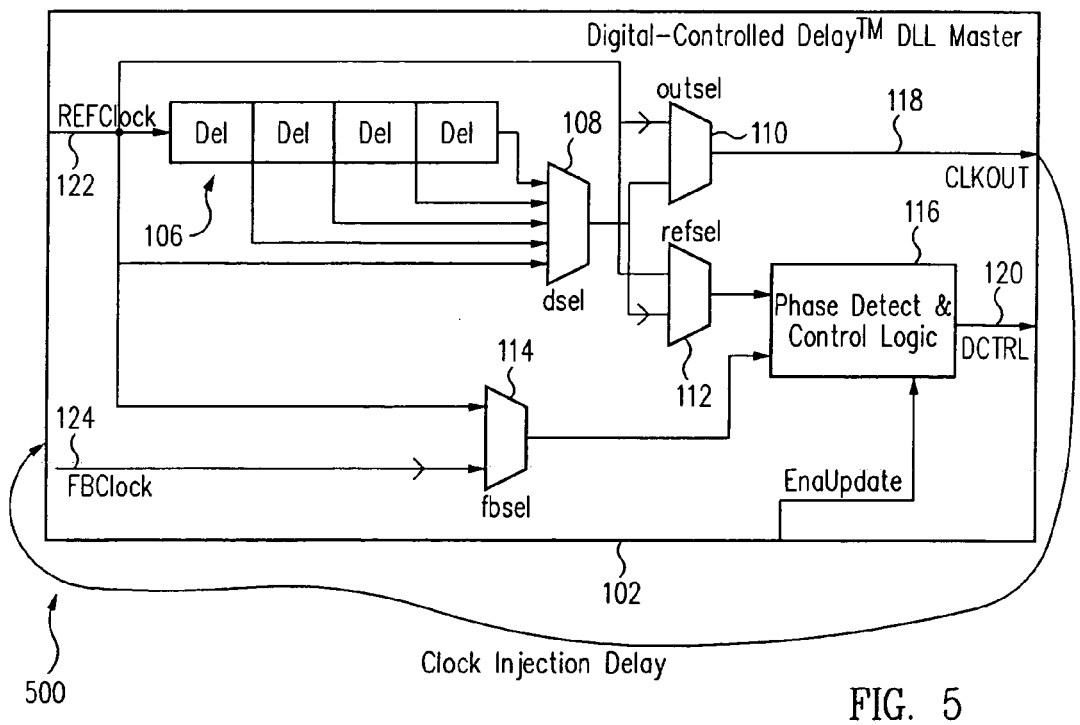
FIG. 5 shows a block diagram illustrating an exemplary application for the master delay-locked loop of FIG. 1.

FIG. 5 shows a block diagram illustrating an exemplary application 500 for master DLL 102 of FIG. 1. In this example, master DLL 102 is employed to control slave delay cells 104 via control signals 120 in order to match clock injection delay on their respective signal (e.g., data) paths regardless of process, voltage, or temperature variations. Multiplexer 110 selects reference clock signal 122, multiplexer 112 selects an output signal from multiplexer 108, and multiplexer 114 selects feedback clock signal 124. Reference clock signal 122 may then directly drive the clock network (such as primary, secondary, or edge clock) of the programmable logic device via clock signal 118. Clock signal 118 is fed back to provide feedback clock signal 124, which is compared to the internally delayed clock and phase aligned such that delay cells 106 provide a delay that matches the clock injection time. Control signals 120 are routed to slave delay cells 104 on corresponding data paths to delay the data to match the clock distribution delay.

Figure 6:
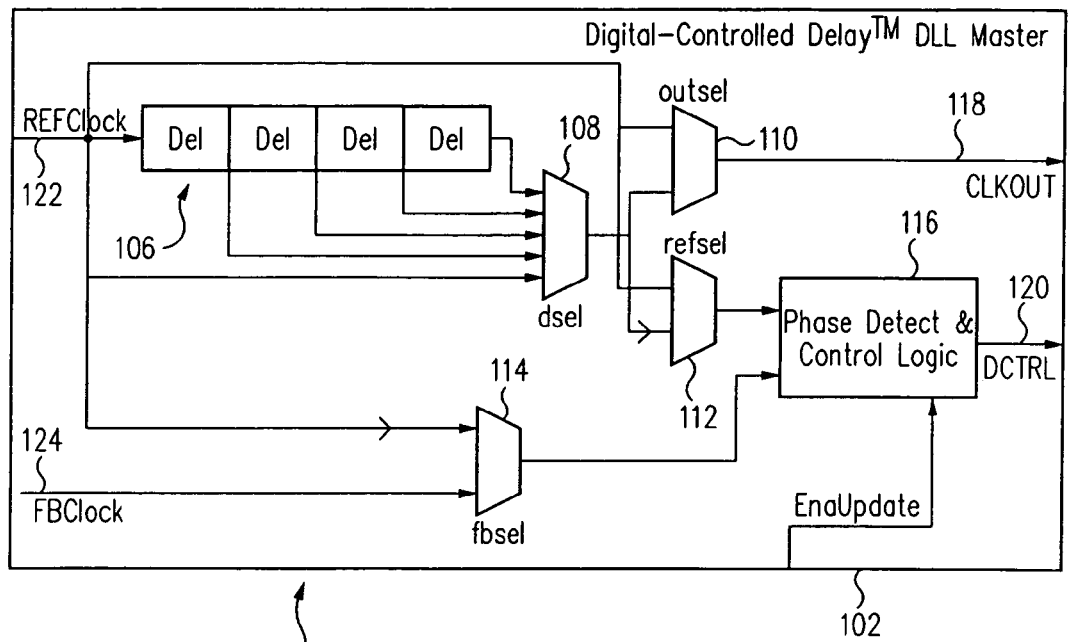
FIG. 6 shows a block diagram illustrating an exemplary application for the master delay-locked loop of FIG. 1.

FIG. 6 shows a block diagram illustrating an exemplary application 600 for master DLL 102 of FIG. 1. In this example, master DLL 102 is employed to control slave delay cells 104 via control signals 120 so that they provide a fixed delay. Multiplexer 112 selects an output signal from multiplexer 108 and multiplexer 114 selects reference clock signal 122 (clock signal 118 is not used so multiplexer 110 selection is irrelevant). Reference clock signal 122 may be any desired reference clock, such as the clock of the input/output bus or any other generally continuous clock. Delay cells 106 produce one whole clock cycle ("T") of delay to match with the input clock phase via multiplexer 114. The desired fixed delay (T*n/m, where n/m is some fraction) is then determined by control logic 116 and control signals 120 are provided to slave delay cells 104 to provide the desired fixed delay in their signal paths.

Figure 7:
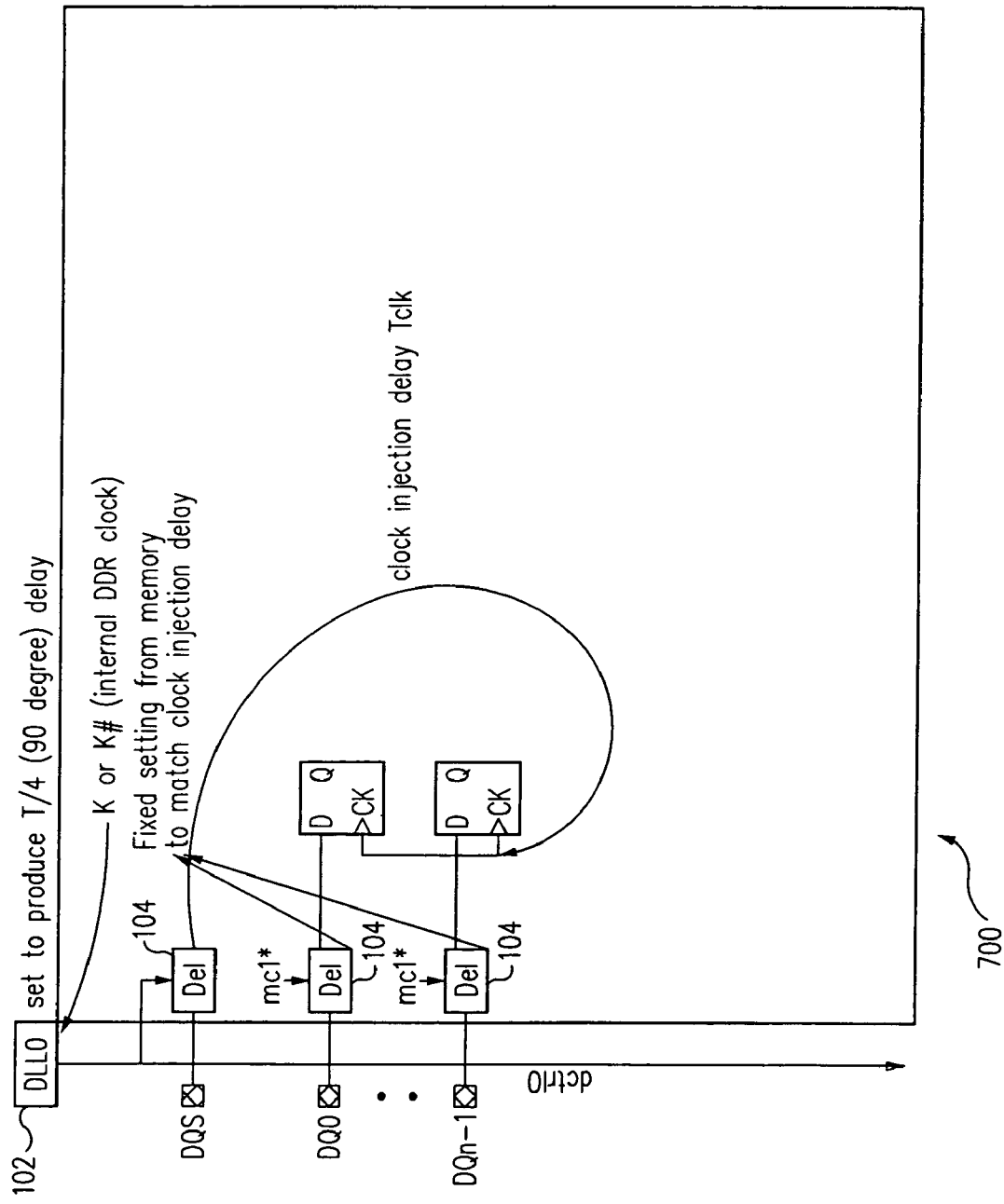
FIG. 7 shows a block diagram illustrating an exemplary application for the master delay-locked loop and the slave delay cells of FIG. 1.

FIG. 7 shows a block diagram illustrating an exemplary application 700 for master DLL 102 and slave delay cells 104 of FIG. 1. In this example, a DDR memory interface is supported that requires a 90 degree delay on a clock signal. The clock signal may be the core clock (internal DDR clock), which is provided to master DLL 102 to determine the 90 degree delay (T/4, where T is the clock cycle of the core clock). Master DLL 102 then controls slave delay cell 104 to provide the required delay on DQS clock path. The delay on DQ0 through DQn−1 may also account for clock injection delays based on known delays for distribution paths, which may be controlled by a fixed setting in memory (the delay may not match perfectly due to process, voltage, and temperature variations)

Figure 8:
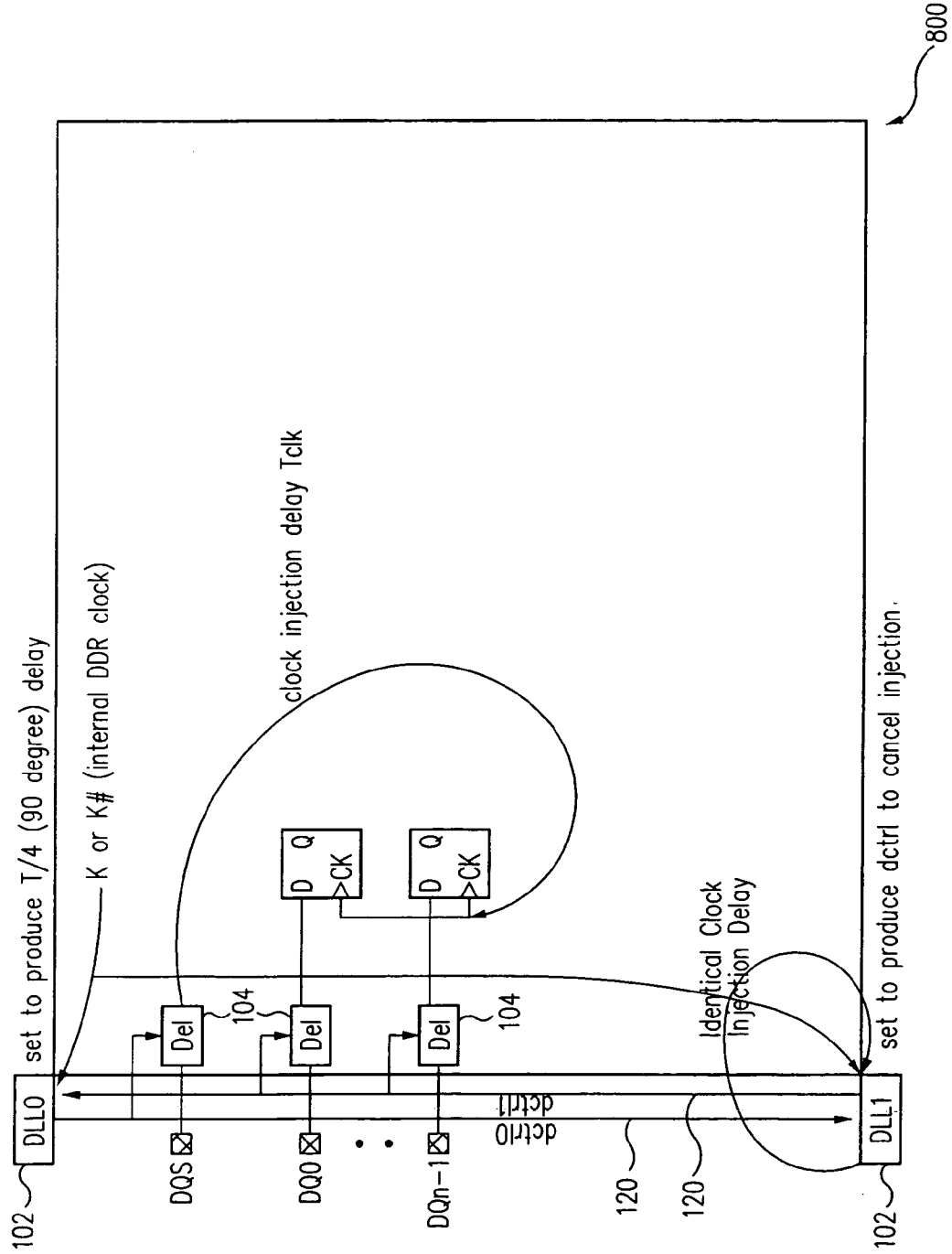
FIG. 8 shows a block diagram illustrating an exemplary application for the master delay-locked loops and the slave delay cells of FIG. 1.

Alternatively, FIG. 8 shows a block diagram illustrating an exemplary application 800 (similar to application 700 of FIG. 7), which employs an additional master DLL 102 to measure clock injection delay. Thus, control signals 120 from one of master DLLs 102 (labeled DLL0) is used by slave delay cell 104 on the DQS clock paths to produce, for example, a T/4 delay, while control signals 120 from the other master DLL 102 (labeled DLL1) is used by slave delay cells 104 on data paths (labeled DQ0 to DQn−1) to produce identical delays that match the clock injection delays.

Figure 9:
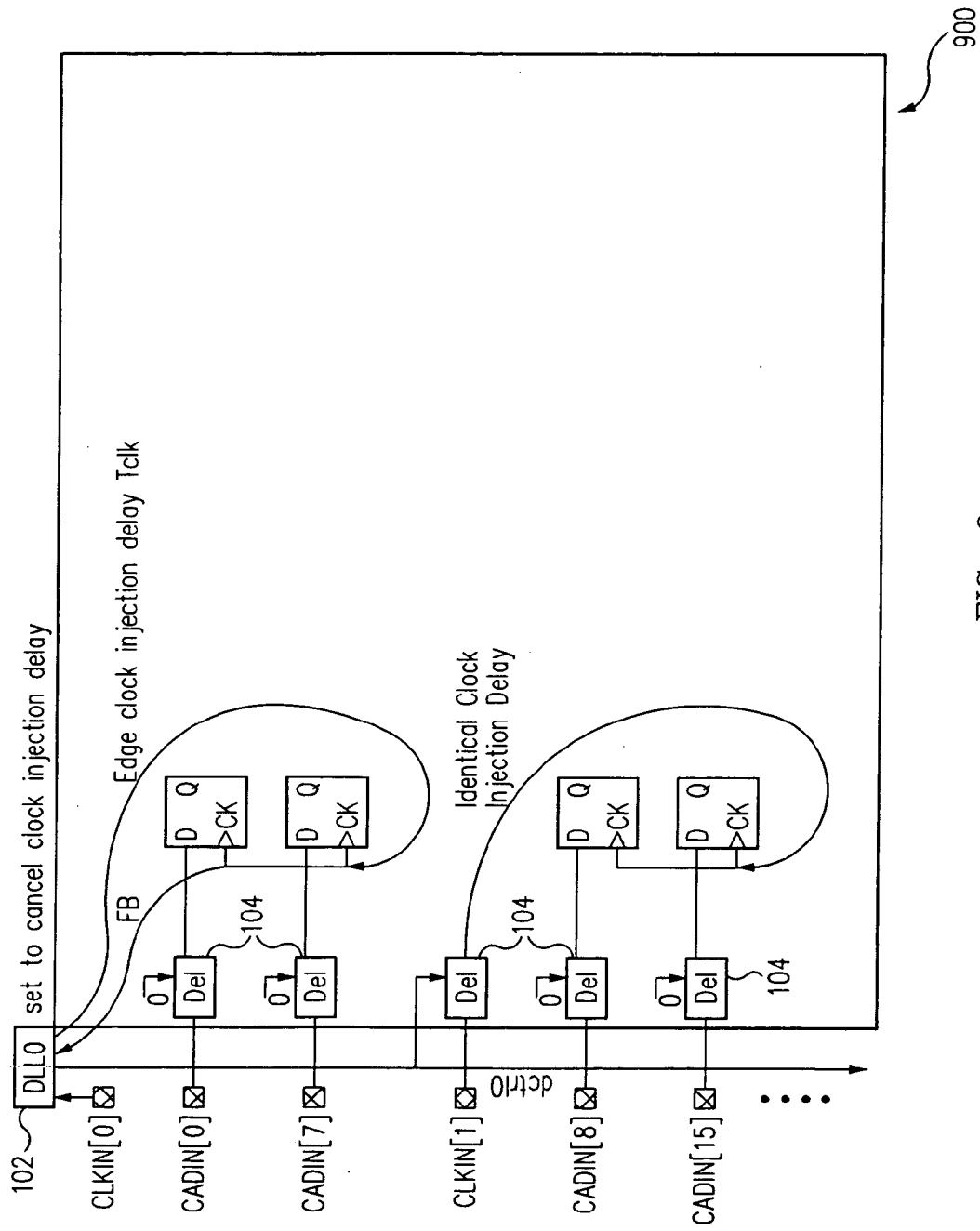
FIG. 9 shows a block diagram illustrating an exemplary application for the master delay-locked loop and the slave delay cells of FIG. 1.

FIG. 9 shows a block diagram illustrating an exemplary application 900 for master DLL 102 and slave delay cells 104 of FIG. 1. In this example, master DLL 102 is employed to cancel clock injection delay on a received clock signal by utilizing a feedback after propagating through the distribution path, as shown. Master DLL 102 also controls slave delay cells 104 to provide the same delay on all clock input paths to cancel the corresponding clock injection delay. For example, this application may be applied to multiple lanes of a HyperTransport input/output interface.

Figure 10:
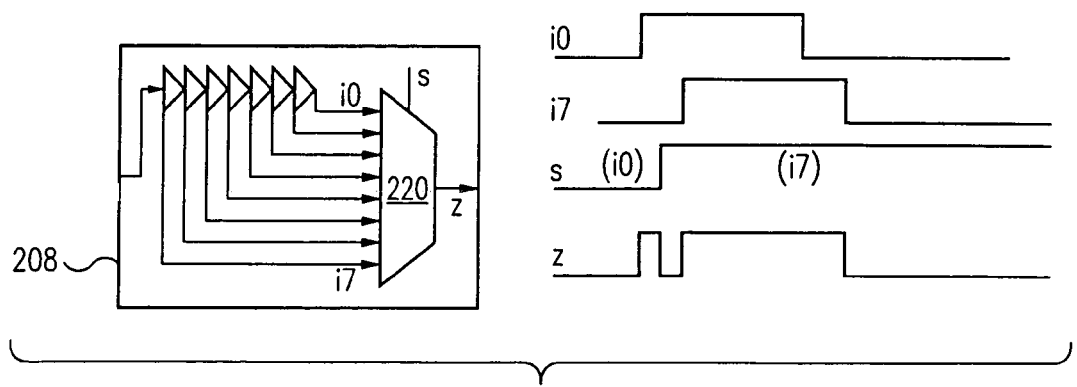
FIG. 10 shows a portion of one of the slave delay cells and a corresponding timing diagram in accordance with an embodiment of the present invention.

FIG. 10 shows fine delay 208 of slave delay cell 104 and a corresponding timing diagram in accordance with an embodiment of the present invention. The timing diagram illustrates that if data and control signal 120 received by slave delay cell 104 are switched at approximately the same time, a glitch may be generated by multiplexer 220 (i.e., as illustrated by an exemplary output waveform Z). The glitch, for example, may be acceptable on data paths, but not acceptable for DQS signals or clock signals, depending upon the application.

To avoid glitches on slave delay cells 104, update (EnaUpdate) signal 130 may be employed. For example, if update signal 130 is equal to zero, then control logic 116 holds the value of control signal 120 to its present value. If update signal 130 is not equal to zero, then control logic 116 allows the value of control signal 120 to be updated with the latest results from control logic circuit 116.

Figure 11:
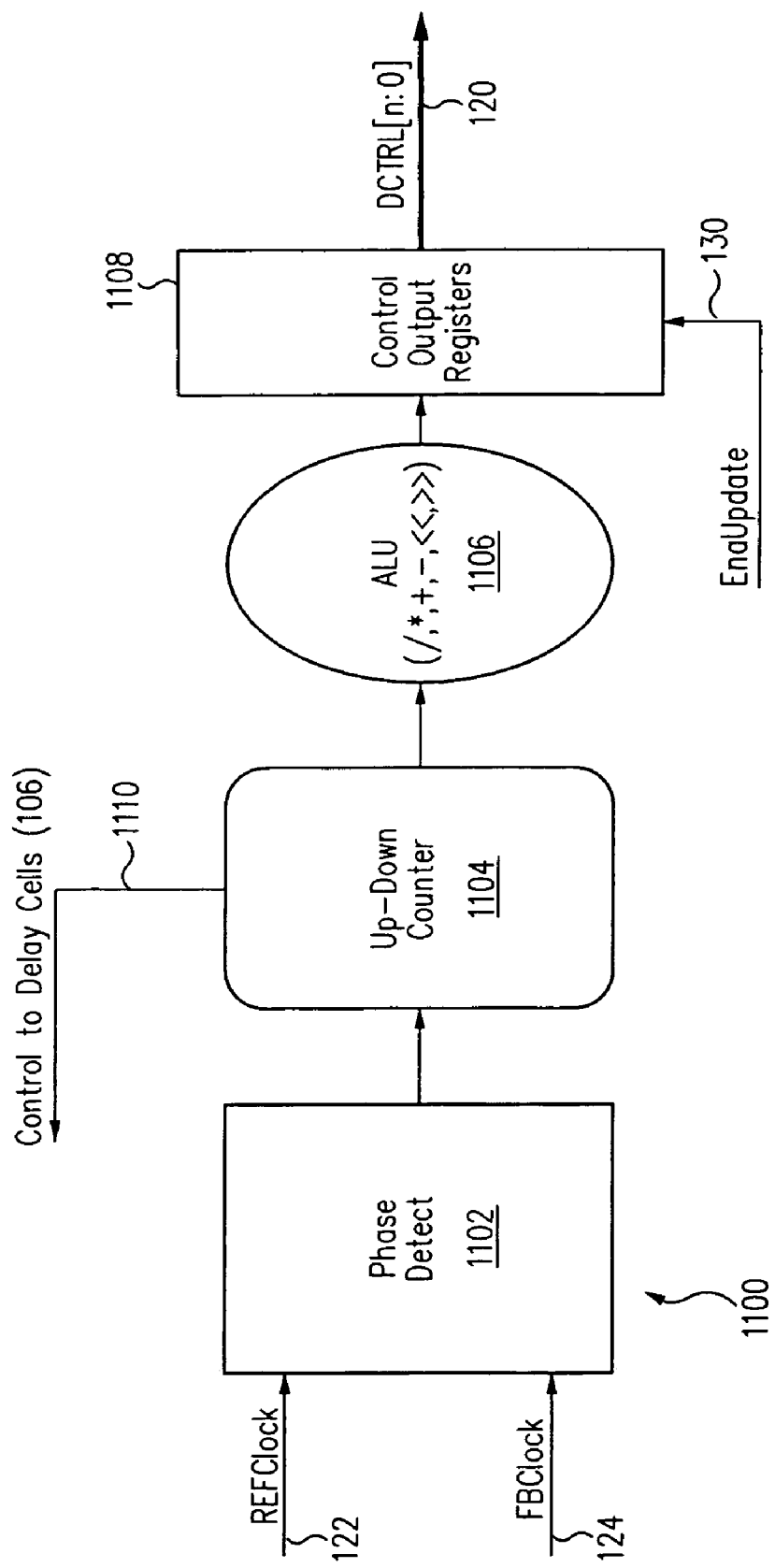
FIG. 11 shows a block diagram illustrating exemplary details for a portion of the master delay-locked loop in accordance with an embodiment of the present invention.

Fig. 11 shows a block diagram 1100 illustrating an exemplary implementation for control logic 116 of master DLL 102 in accordance with an embodiment of the present invention. Block diagram 1100 includes a phase detect block 1102, an up/down counter 1104, an arithmetic logic unit (ALU) 1106, and control output registers 1108. Phase detect block 1102 compares the phase of two signals, such as for example reference clock signal 122 and feedback clock signal 124 (depending upon the selection of multiplexers 112 and 114 of FIG. 1). Phase detect block 1102, based on the phase determination, determines whether up/down counter 1104 needs adjustment up or down. A control signal 1110 from up/down counter 1104 controls delay cells 106 and multiplexer 108 to adjust the total delay, if required, based upon the phase determination.

ALU 1106 performs any mathematical operations on an output signal from up/down counter 1104, if necessary, to generate the necessary amount of delay (e.g., based upon a clock cycle) desired. For example, a determined clock cycle (T) may be divided by four to generate a delay of T/4. Control output registers 1108 then provide control signals 120 for slave delay cells 104 if update signal 130 is asserted, as described above.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   a master delay-locked loop adapted to receive a reference clock signal and provide a digital control signal, wherein the master delay-locked loop comprises;
      a series of delay cells adapted to receive the reference clock signal and provide delayed versions of the reference clock signal;
      a first multiplexer adapted to select either the reference clock signal or one of the delayed versions of the reference clock signal and provide a first output signal;
      a second multiplexer adapted to select either the reference clock signal or the first output signal and provide a clock output signal from the master delay-locked loop;
      a third multiplexer adapted to select either the reference clock signal or the first output signal and provide a second output signal;
      a fourth multiplexer adapted to select either the reference clock signal or a feedback signal received by the master delay-locked loop and provide a third output signal; and
      a control logic circuit adapted to receive the second output signal and the third output signal and generate the digital control signal;
   a plurality of signal paths; and
   a plurality of slave delay cells disposed respectively within the plurality of signal paths and adapted to receive the digital control signal and provide a signal delay based on the digital control signal.

2. The programmable logic device of claim 1, wherein the control logic circuit comprises:
   a phase detect circuit adapted to receive the second output signal and the third output signal;

a counter coupled to the phase detect circuit and adapted to control a delay applied by the series of delay cells;

an arithmetic logic unit coupled to the counter and adapted to selectively perform an arithmetic operation upon a counter output signal; and a register coupled to the arithmetic logic unit and adapted to provide the digital control signal.

3. The programmable logic device of claim 2, wherein the register is permitted to change a value of the digital control signal if an update signal received by the register is asserted.

4. The programmable logic device of claim 1, wherein each of the slave delay cells further comprises;

a coarse stage adapted to receive an input signal and provide delayed versions of the input signal;

a first multiplexer adapted to select either the input signal or one of the delayed versions of the input signal and provide a first output signal;

a fine stage coupled to the first multiplexer and adapted to receive the first output signal and provide fine delayed versions of the first output signal; and a second multiplexer adapted to select either the first output signal or one of he fine delayed versions of the first output signal and provide a second output signal.

5. The programmable logic device of claim 4, wherein each of the slave delay cells further comprises a third multiplexer adapted to receive at least the digital control signal and a first control signal from a memory and provide a second control signal to the first multiplexer and the second multiplexer.

6. The programmable logic device of claim 5, further comprising a second master delay-locked loop adapted to provide a second digital control signal to the third multiplexer, which may be selected as the second control signal.

7. The programmable logic device of claim 1, wherein the master delay-locked loop controls the slave delay cells to cancel or match clock injection delay or provide a fixed delay based on a clock cycle of the reference clock signal.

8. A delay cell architecture comprising:

a master delay cell adapted to receive a reference clock signal and a feedback signal and provide a clock signal and digital control signals, wherein the waster delay cell has means for generating a plurality of delayed versions of the reference clock signal and means for determining a phase between the reference clock signal or one of the plurality of delayed versions of the reference clock signal and the feedback signal or the reference clock signal to determine one or more values for the digital control signals;

a plurality of slave delay cells disposed on a plurality of corresponding signal paths and adapted to receive the digital control signals, wherein each of the slave delay cells has means for receiving an input signal and selectively applying a delayed output signal based on one of the digital control signals;

a second master delay cell; and a memory adapted to provide a static memory digital control signal, wherein the plurality of slave delay cells is further adapted to receive the digital control signals from the second master delay cell and the memory digital control signal, wherein the delayed output signal is based on the memory digital control signal or the digital control signal from master delay cell or second master delay cell.

9. The delay cell architecture of claim 8, wherein the master delay cell controls a first set of the plurality of slave delay cells to provide a signal delay for a clock signal and the second master delay cell controls a second set of the plurality of slave delay cells to provide a signal delay for a data signal.

10. The delay cell architecture of claim 8, wherein the master delay cell controls the slave delay cells to substantially cancel clock injection delay.

11. A method of inserting a delay into a plurality of signal paths of a programmable logic device, the method comprising:

receiving a reference clock signal;

generating delayed versions of the reference clock signal;

receiving a feedback clock signal;

selecting between the reference clock signal and one of the delayed versions of the reference clock signal to provide a first signal;

selecting between the reference clock signal and the feedback clock signal to provide a second signal;

determining a phase difference between the first signal and the second signal; and providing one or more control signals based on the determined phase difference to delay cells within the plurality of signal paths.

12. The method of claim 11, further comprising generating a clock signal based on the reference clock signal or one of the delayed versions of the reference clock signal.

13. The method of claim 11, wherein the delay cells provide a coarse delay and a fine delay based on the control signals.

14. The method of claim 11, wherein the control signals may be provided by memory or one or more master delay cells.

15. The method of claim 11, wherein the control signals determine a signal delay for one or more of the delay cells based on a fraction of a clock cycle of the reference clock signal.

16. The method of claim 11, wherein the delay cells provide a signal delay that approximately cancels or matches a path delay.

17. A master delay-locked loop circuit within a programmable logic device, the circuit comprising:

a series of delay cells adapted to receive a reference clock signal and provide delayed versions of the reference clock signal;

a first multiplexer adapted to select either the reference clock signal or one of the delayed versions of the reference clock signal and provide a first output signal;

a second multiplexer adapted to select either the reference clock signal or the first output signal and provide a clock output signal from the master delay-locked loop circuit;

a third multiplexer adapted to select either the reference clock signal or the first output signal and provide a second output signal;

a fourth multiplexer adapted to select either the reference clock signal or a feedback signal received by the master delay-locked loop circuit and provide a third output signal; and a control logic circuit adapted to receive the second output signal and the third output signal and generate a digital control signal.

18. The circuit of claim 17, wherein the control logic circuit comprises:

a phase detect circuit adapted to receive the second output signal and the third output signal;

a counter coupled to the phase detect circuit and adapted to control a delay applied by the series of delay cells;

an arithmetic logic unit coupled to the counter and adapted to selectively perform an arithmetic operation upon a counter output signal; and a register coupled to the arithmetic logic unit and adapted to provide the digital control signal.

* * * * *

UNITED STATES PATENT AND TRADEMARK OFFICE
CERTIFICATE OF CORRECTION

| | | |
|---|---|---|
| PATENT NO. | : 7,009,433 B2 | Page 1 of 1 |
| APPLICATION NO. | : 10/447451 | |
| DATED | : March 7, 2006 | |
| INVENTOR(S) | : Fulong Zhang et al. | |

It is certified that error appears in the above-identified patent and that said Letters Patent is hereby corrected as shown below:

Col. 9, line 21 - Delete "he" and insert --the--.

Col. 9, line 39 - Delete "waster" and insert -- master --.

Signed and Sealed this

Twenty-sixth Day of June, 2007

JON W. DUDAS
*Director of the United States Patent and Trademark Office*